(12) United States Patent
Stahr et al.

(10) Patent No.: US 11,495,513 B2
(45) Date of Patent: Nov. 8, 2022

(54) COMPONENT CARRIER WITH EMBEDDED SEMICONDUCTOR COMPONENT AND EMBEDDED HIGHLY-CONDUCTIVE BLOCK WHICH ARE MUTUALLY COUPLED

(71) Applicant: AT&S Austria Technologie & Systemtechnik Aktiengesellschaft, Leoben (AT)

(72) Inventors: Johannes Stahr, St. Lorenzen im Murztal (AT); Andreas Zluc, Leoben (AT); Mike Morianz, Graz (AT); Heinz Moitzi, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 289 days.

(21) Appl. No.: 16/827,193

(22) Filed: Mar. 23, 2020

(65) Prior Publication Data

US 2020/0312737 A1    Oct. 1, 2020

(30) Foreign Application Priority Data

Mar. 29, 2019  (EP) ..................... 19166119

(51) Int. Cl.
*H01L 23/34* (2006.01)
*H01L 23/367* (2006.01)
(Continued)

(52) U.S. Cl.
CPC .... *H01L 23/3675* (2013.01); *H01L 23/49822* (2013.01); *H05K 1/0272* (2013.01); *H05K 3/4644* (2013.01); *H05K 2201/10166* (2013.01)

(58) Field of Classification Search
CPC .......... H01L 23/3675; H01L 23/49822; H05K 1/0272; H05K 3/4644; H05K 2201/10166
(Continued)

(56) References Cited

U.S. PATENT DOCUMENTS 7,061,100 B2 *  6/2006  Iwaki ..................... H01L 23/552
                                              257/E23.114
8,872,328 B2 * 10/2014  Delgado ................. H01L 23/13
                                              257/E23.08
(Continued)

FOREIGN PATENT DOCUMENTS

CN    201397814 Y    2/2010
DE    1 909 834 A1   10/1969
(Continued)

OTHER PUBLICATIONS

Extended European Search Report in Application No. 19166119.8, dated Oct. 23, 2019, pp. 1-11, European Patent Office, 80298, Munich, Germany.

*Primary Examiner* — Luan C Thai
(74) *Attorney, Agent, or Firm* — Robert A. Blaha; Smith Tempel Blaha LLC

(57) ABSTRACT

A component carrier with a stack that has at least one electrically conductive layer structure and/or at least one electrically insulating layer structure, a semiconductor component embedded in the stack, and a highly-conductive block embedded in the stack and being thermally and/or electrically coupled with the semiconductor component is illustrated and described.

20 Claims, 10 Drawing Sheets

(51) Int. Cl.
*H01L 23/498* (2006.01)
*H05K 1/02* (2006.01)
*H05K 3/46* (2006.01)

(58) Field of Classification Search
USPC .......................................... 257/712; 438/122
See application file for complete search history.

(56) References Cited

U.S. PATENT DOCUMENTS

| | | | |
|---|---|---|---|
| 9,107,290 | B1 | 8/2015 | Chen |
| 9,349,671 | B2 * | 5/2016 | Coullomb ............. H01L 23/473 |
| 9,711,428 | B2 * | 7/2017 | Braunisch ......... H01L 23/49811 |
| 9,955,591 | B2 * | 4/2018 | Tomikawa ........... H05K 3/4697 |
| 10,141,182 | B1 | 11/2018 | Molla et al. |
| 2010/0295170 | A1 | 11/2010 | Komura et al. |
| 2012/0140420 | A1 | 6/2012 | Soyano et al. |
| 2012/0170225 | A1 | 7/2012 | Liu |
| 2015/0102499 | A1 | 4/2015 | Coullomb |
| 2016/0050771 | A1 | 2/2016 | Yu et al. |
| 2017/0287808 | A1 | 10/2017 | Braunlsch et al. |
| 2018/0063965 | A1 | 3/2018 | Leitgeb et al. |
| 2018/0206325 | A1 | 7/2018 | McIntyre et al. |
| 2018/0233429 | A1 * | 8/2018 | Yosui .................. H01L 23/5383 |
| 2019/0057924 | A1 * | 2/2019 | Kim .................... H01L 23/5389 |

FOREIGN PATENT DOCUMENTS

| | | |
|---|---|---|
| EP | 2 854 168 A2 | 4/2015 |
| EP | 3364456 A2 | 8/2018 |
| WO | 2010078021 A2 | 7/2010 |
| WO | 2016071324 A1 | 5/2016 |
| WO | 2018053729 A1 | 3/2018 |

* cited by examiner

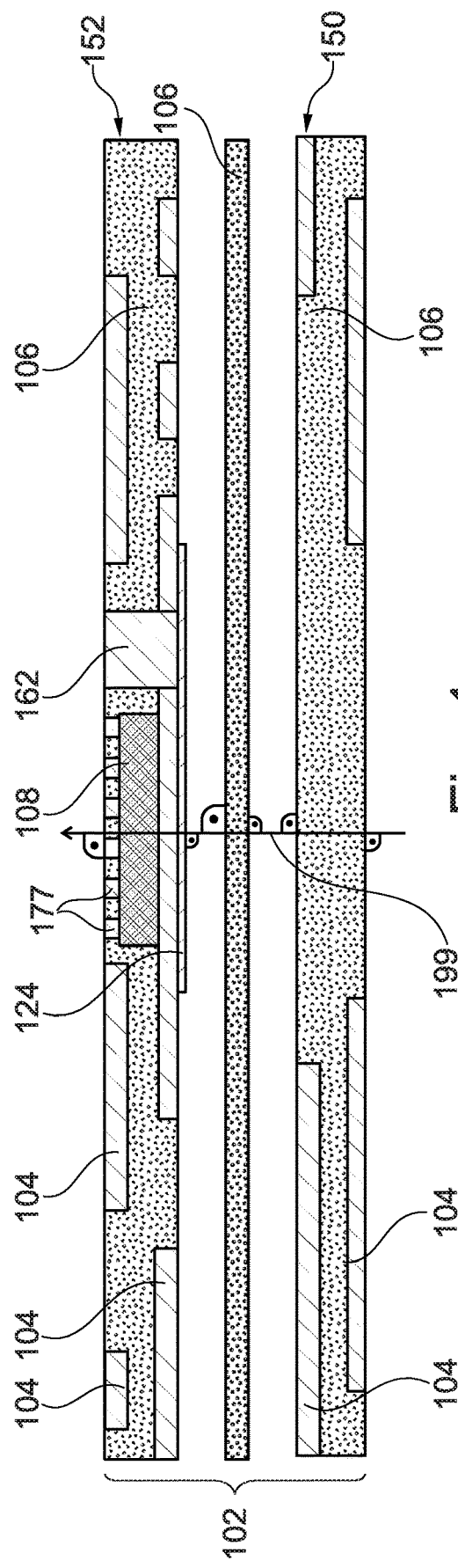
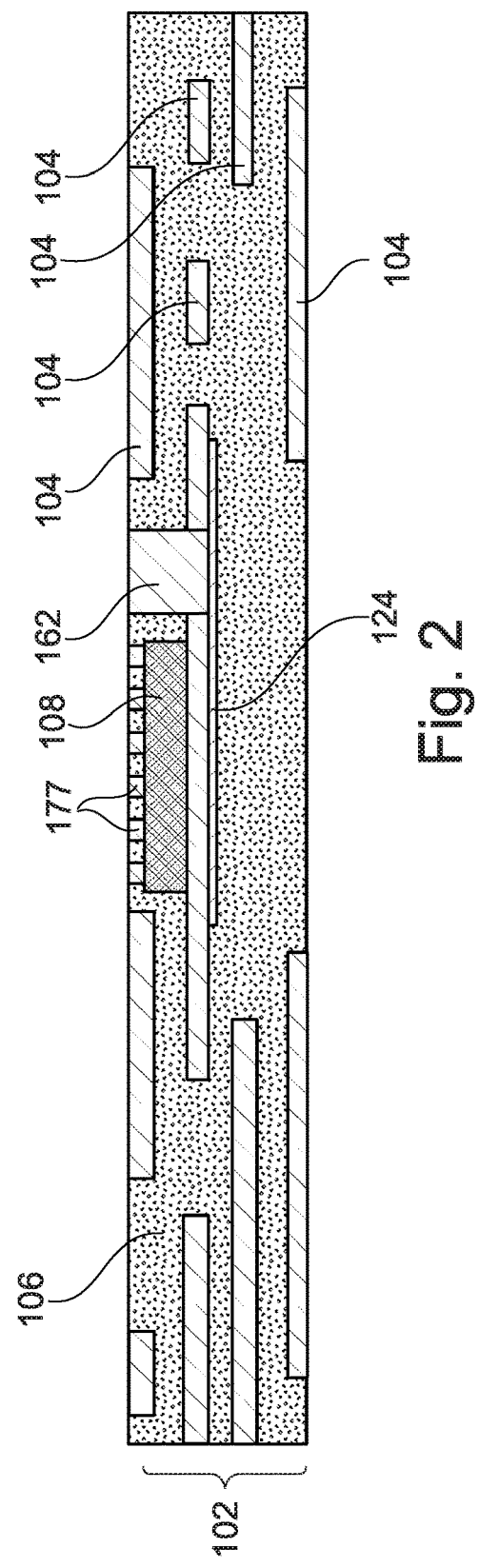
Fig. 1
Fig. 2

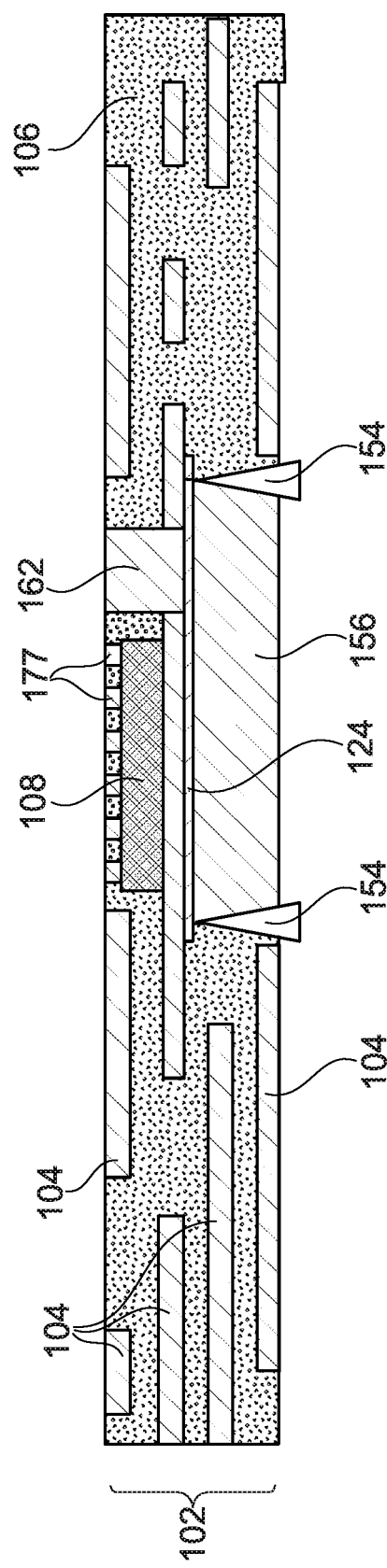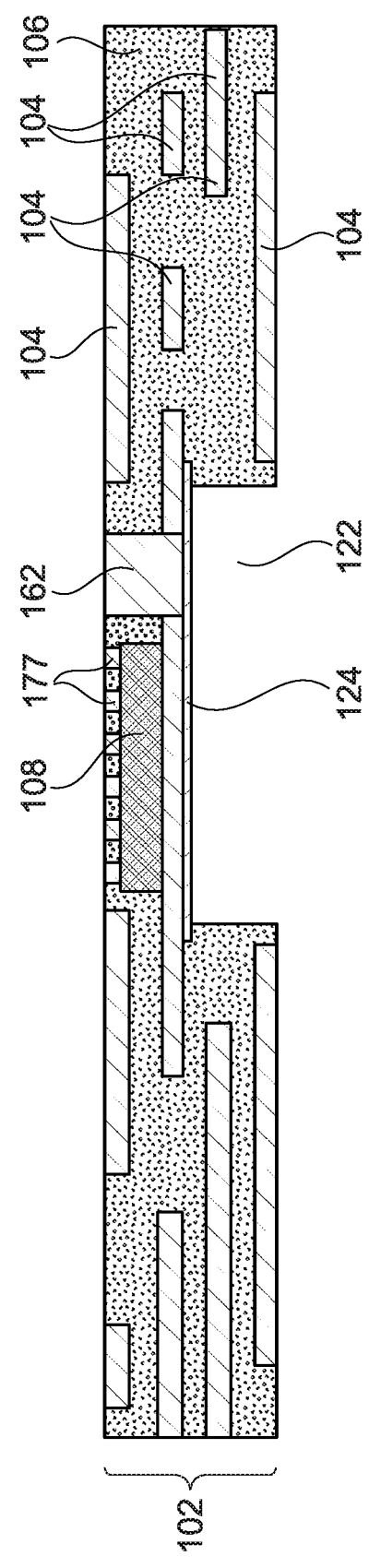

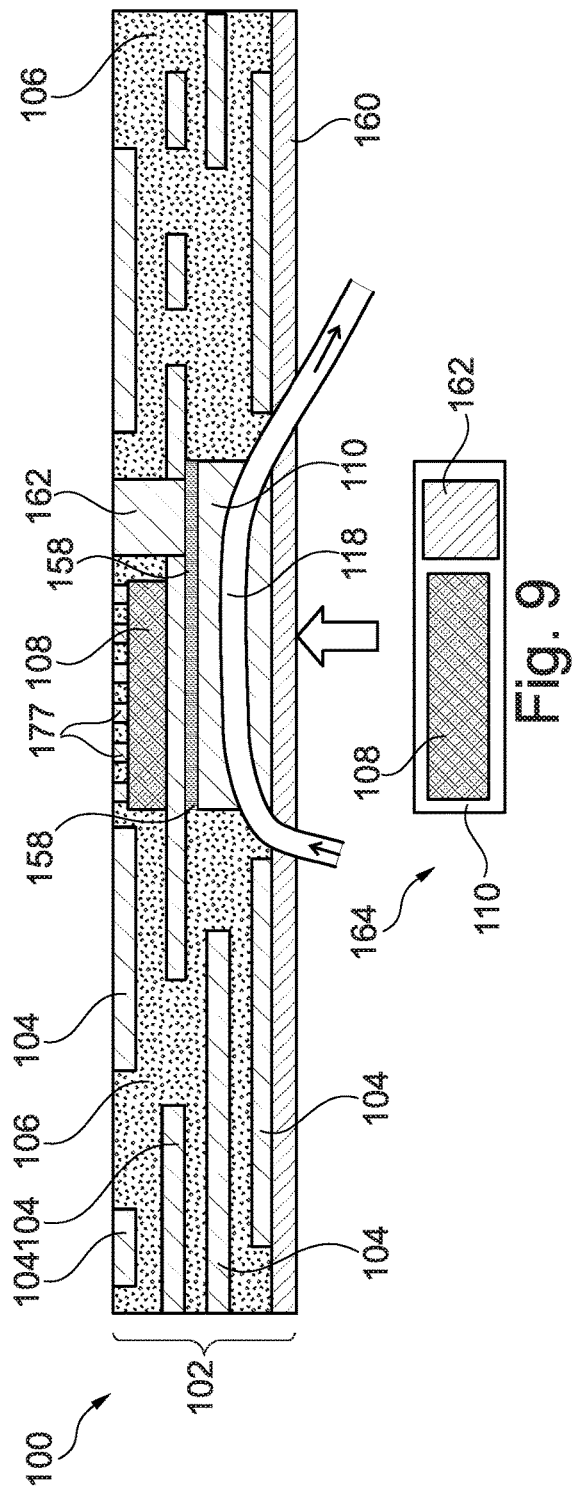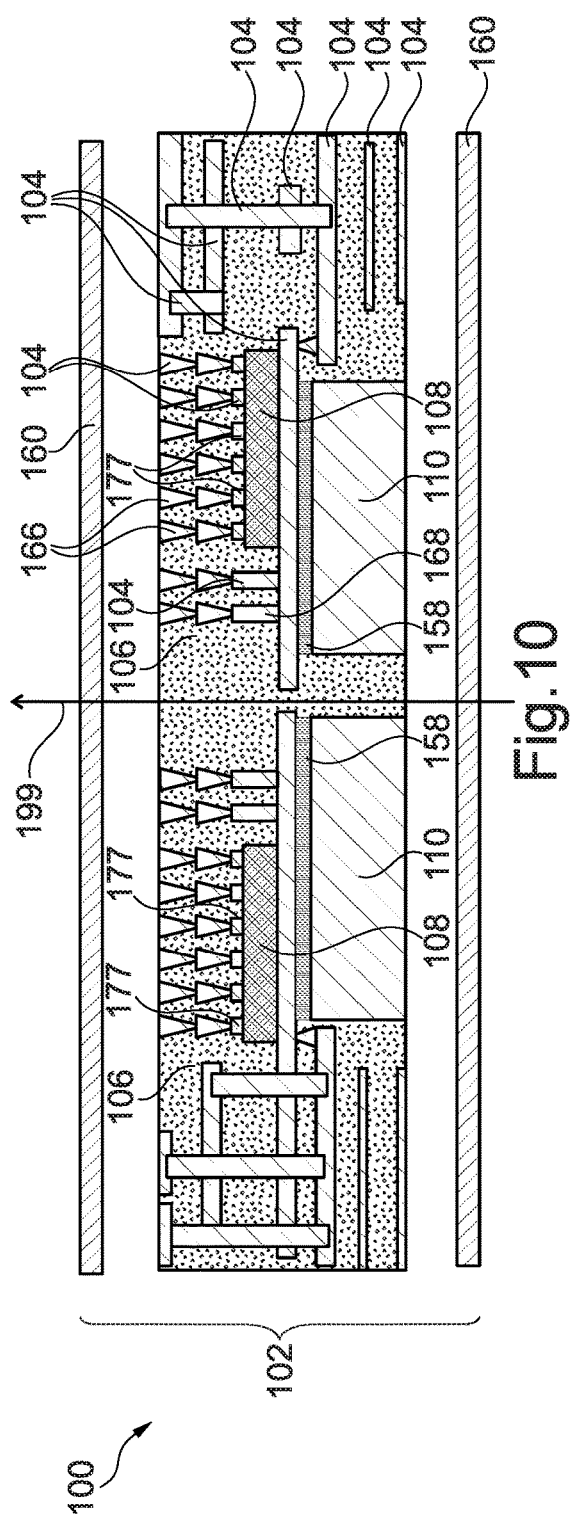

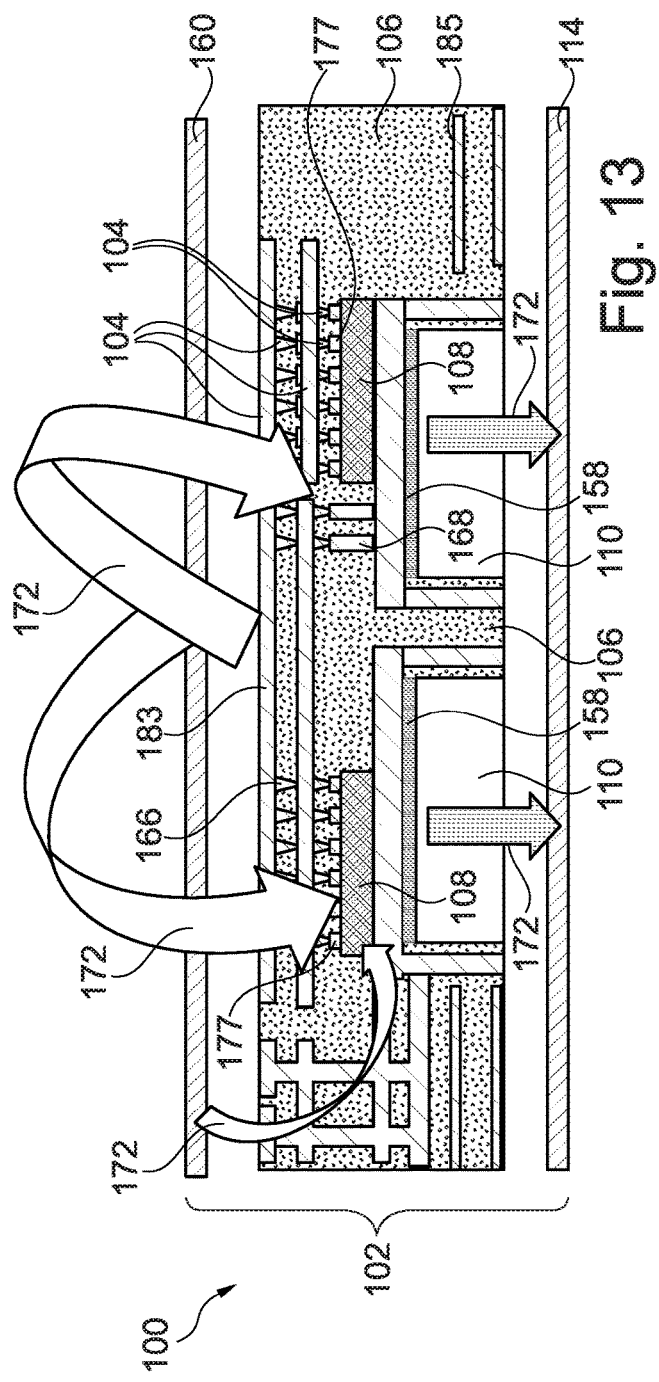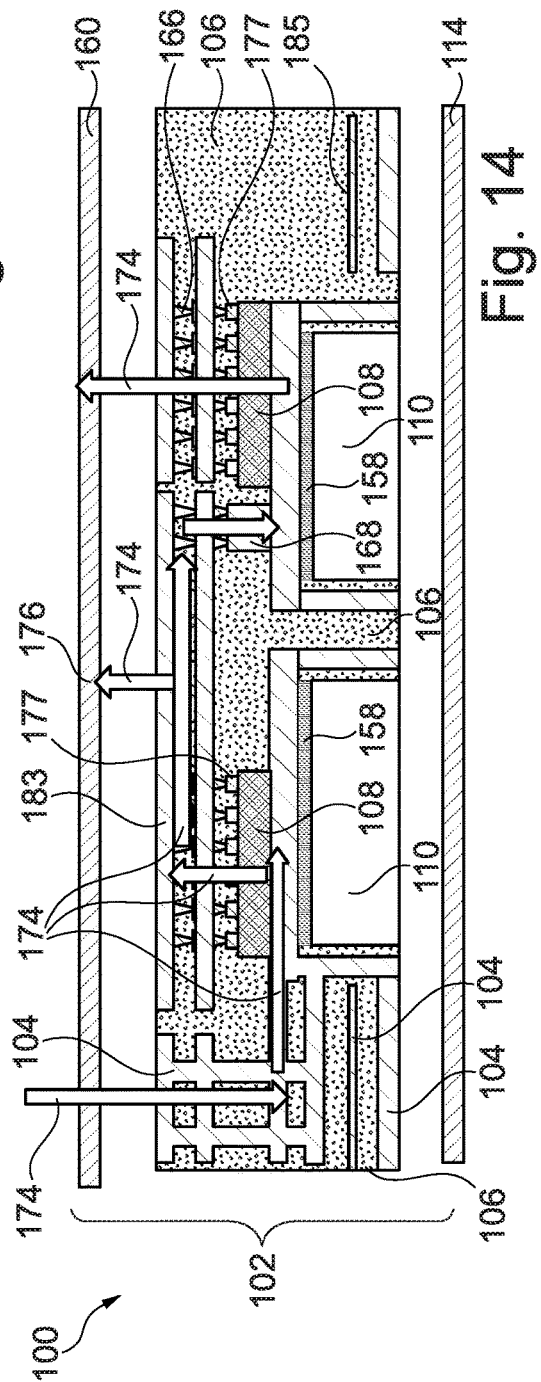

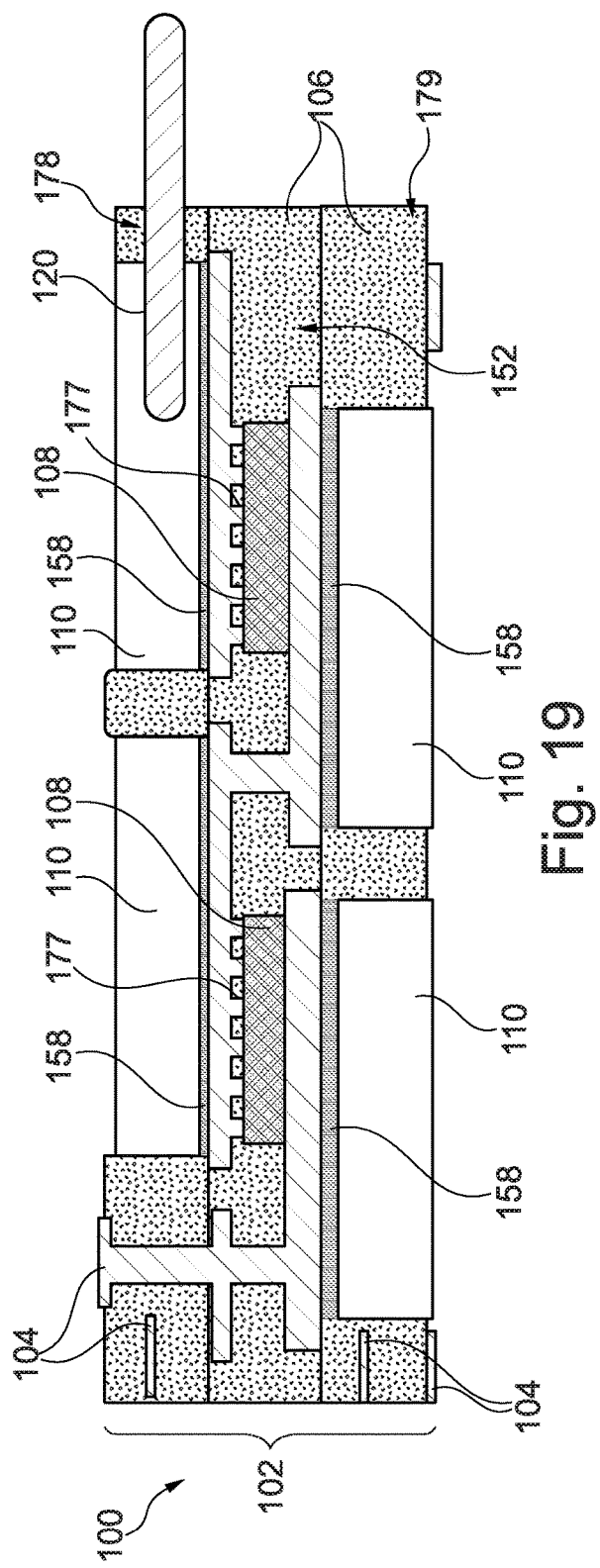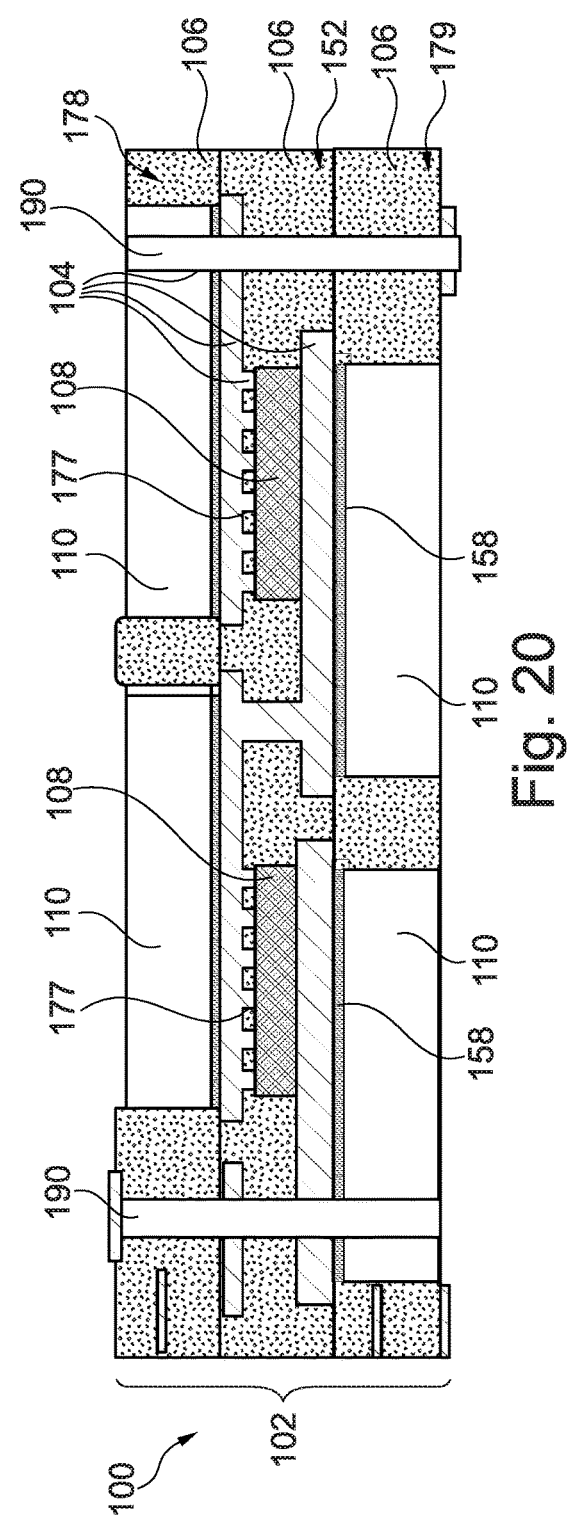

COMPONENT CARRIER WITH EMBEDDED SEMICONDUCTOR COMPONENT AND EMBEDDED HIGHLY-CONDUCTIVE BLOCK WHICH ARE MUTUALLY COUPLED

CROSS-REFERENCE TO RELATED APPLICATION

This application claims the benefit of the filing date of the European Patent Application No. 19 166 119.8, filed Mar. 29, 2019, the disclosure of which is hereby incorporated herein by reference.

TECHNICAL FIELD

The invention relates to a method of manufacturing a component carrier, to a component carrier, and to a method of use.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

In particular, efficiently embedding a component in a component carrier is an issue.

SUMMARY

There may be a need to efficiently embed a component in a component carrier.

According to an exemplary embodiment of the invention, a component carrier is provided, wherein the component carrier comprises a stack comprising at least one electrically conductive layer structure and/or at least one electrically insulating layer structure, a semiconductor component (or multiple components) embedded in the stack, and a highly-conductive block embedded in the stack and being thermally and/or electrically coupled with the semiconductor component.

According to another exemplary embodiment of the invention, a method of manufacturing a component carrier is provided, wherein the method comprises forming (in particular laminating) a stack comprising at least one electrically conductive layer structure and/or at least one electrically insulating layer structure, embedding a semiconductor component in the stack, and embedding a highly-conductive block in the stack so that the block is thermally and/or electrically coupled with the semiconductor component.

According to another embodiment, a method includes the steps of providing a component carrier, which includes a stack with at least one electrically conductive layer structure and/or at least one electrically insulating layer structure, the component carrier further having a semiconductor component embedded in the stack, and a highly-conductive block embedded in the stack and being thermally and/or electrically coupled with the semiconductor component; and conducting an electric current of at least 100 Ampère, in particular in a range between 100 Ampère and 10000 Ampère, by the highly-conductive block embedded in the stack.

According to yet another exemplary embodiment of the invention, a component carrier having the above-mentioned features is used for conducting an electric current of at least 100 Ampère (in particular in a range between 100 Ampère and 10000 Ampère) by the block (and optionally additionally by the semiconductor component and/or at least one of the at least one electrically conductive layer structure).

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "semiconductor component" may particularly denote a component comprising a semiconductor material, in particular as a primary or basic material. The semiconductor material may for instance be a type IV semiconductor such as silicon or germanium, or may be a type III-V semiconductor material such as gallium arsenide. In particular, the semiconductor component may be a semiconductor chip such as a naked die or a molded die.

In the context of the present application, the term "highly-conductive block" may particularly denote a bulky body (such as a body shaped as a cuboid or cylinder or disc) made of a material having a high electrical conductivity and/or a high thermal conductivity. In terms of electrical conductivity, a highly electrically conductive block may have a metallic conductivity, i.e. an electrical conductivity as a metal. For instance, the electrical conductivity of the electrically highly conductive body at 20° C. may be at least 5.106 S/m, in particular at least 2.107 S/m. In terms of thermal conductivity, the thermal conductivity of the material of a thermally highly-conductive block may be at least 50 W/mK, in particular at least 100 W/m K.

According to an exemplary embodiment of the invention, a component carrier is provided which has embedded in an interior thereof, in particular completely within stack material, a semiconductor component such as a silicon chip, and a highly-conductive block connected to the semiconductor component. Advantageously, the embedded semiconductor component and the embedded block may be thermally and/or electrically coupled with one another. By taking this measure, it is efficiently possible to conduct electricity and/or heat from the semiconductor component generated during operation of the component carrier away from an interior of the component carrier (in particular up to a periphery) via the highly-conductive block with low electric resistance and/or low thermal resistance and with short thermal and/or electric path(s). This improves the electric performance, the thermal performance and thus the overall reliability of the component carrier, since undesired effects such as the generation of thermal load and consequently undesired phenomena such as warpage may be strongly suppressed. In particular when electrically coupling embedded semiconductor component and embedded block, extremely high electric current of 100 Ampère or more can be conducted through the bulky block without excessive heating of the component carrier. It may also be possible to use the block synergistically to remove considerable amount of heat generated by such a high current operation of the component carrier.

In the following, further exemplary embodiments of the manufacturing method, the method of use, and the component carrier will be explained.

In an embodiment, the semiconductor component is embedded in the stack more centrally (in particular deeper in an interior of the stack and/or closer to a vertical center of the stack) in a stacking direction of the stack than the block. Thus, the block may be embedded more peripherally in the stack than the semiconductor component. A flow of heat and/or electricity may thus be from the central semiconductor component to the more peripheral block. This enables the block to contribute to a flow of heat and/or electric current and/or signals from an interior to an exterior of the stack. In other words, the block may be arranged closer to the periphery of the stack than the more centrally located semiconductor component.

Alternatively, it is also possible that the semiconductor component is embedded in the stack less centrally than the block. It is also possible that the semiconductor component and the stack are embedded at corresponding levels in the stack. In particular, the component carrier may have a symmetrical or an asymmetrical build-up. Even with an asymmetric build up, it may be advantageous (although this is not mandatory) that the semiconductor component is located more centrally than the block, as a block located towards the outside or one outer surface of the package may conduct heat and/or current in a particular efficient way.

In an embodiment, the block is a thermally highly-conductive block and/or an electrically highly-conductive block. When the block is made of a material having a high electric and thermal conductivity, the block may synergistically contribute to heat removal during operation of the component carrier as well as conductance of electric current or electric signals from the embedded semiconductor component to an electronic periphery or at least along electrically conductive traces of the component carrier.

In an embodiment, the block is made of copper and/or aluminum. Copper and aluminum both have a high conductivity in terms of electricity and heat and are also compatible with component carrier (in particular printed circuit board) manufacturing technology. However, it is also possible that the block comprises, additionally or alternatively, graphite, a graphite/aluminum compound, or a ceramic with a coating (in particular a copper coating).

In an embodiment, the block is an inlay. In this context, an inlay may be a readily manufactured body which is, only after completion of its manufacture, inserted into the stack. For example, an inlay may be a solid body being substantially free of interior voids.

In an embodiment, the block is formed as a three-dimensional sinter body. Correspondingly, the manufacturing method may comprise forming the block by carrying out a three-dimensional sinter process. For example, such a three-dimensional sinter process may be carried out by additive manufacturing, in particular by sintering highly-conductive powder by a laser treatment or the like. Hence, sintering the block can be made possible for instance with a three-dimensional additive manufacturing technology such as three-dimensional printing. It is however also possible that thermal energy required for sintering is provided in another way, for instance in an oven. Thus, the block can be formed by sintering. The connection of sinter particles by sintering to form the block may be carried out before inserting the sintered block in a cavity of the stack. It may however also be possible to manufacture the block by sintering material during manufacture of the component carrier, for instance after having placed sinter powder in a cavity in the stack, and by subsequently sintering the sinter powder in the cavity to thereby form the block by interconnecting the sinter powder particles.

Advantageously, the manufacturing method may comprise connecting the semiconductor component to the block by sintering. Correspondingly, the component carrier may comprise a sinter connection structure as an interface between body and semiconductor component. Highly advantageously, the connection of the block to the stack and/or to the semiconductor component can be accomplished by sintering. Thereby, a reliable connection can be established during manufacturing the block. Energy required for establishing this interconnection between the block on the one hand and the semiconductor component and/or the electrically conductive layer structure on the other hand may be provided by energy supplied during or for lamination of the stack, by a laser beam, etc.

In an embodiment, the block extends up to (i.e., is aligned with or is flush with) an exterior main surface of the stack or extends only partially beyond (i.e., protrudes over) an exterior main surface of the stack. By extending up to a surface or even protruding beyond an exterior surface of the stack, the block may be mounted at a periphery of the stack and therefore in a way as to be able to remove efficiently heat out of an interior of the component carrier.

In an embodiment, the block is configured for removing and/or spreading heat generated by the semiconductor component during operation of the component carrier. For instance, when the semiconductor component is a power semiconductor or another high-performance semiconductor chip such as a microcontroller, a significant amount of heat can be generated during operation. This heat can be removed at least partially out of an interior of the component carrier so as to reduce thermal load and undesired phenomena such as warpage or the formation of cracks. Heat spreading (preferably over an angle of at least 45°) may relate to the distribution of heat from a hotspot over a larger area or volume of the component carrier so as to reduce or equilibrate temperature differences in an interior of the component carrier.

In an embodiment, the block is connected with the at least one electrically conductive layer structure and/or with the semiconductor component for conducting electric current or electric signals during operation of the component carrier. Thus, an electrically conductive connection between the block and an electrically conductive portion (in particular one or more pads) of the semiconductor component may be established. By taking this measure, the massive block may carry electric current or electric signals in a low ohmic way during operation of a component carrier.

Advantageously, the block may be configured to contribute both to heat removal and conductance of an electric current.

In an embodiment, the component carrier comprises at least one further highly-conductive block, in particular having the above-mentioned features, embedded in the stack in such a way that the semiconductor component is embedded in the stack more centrally in a stacking direction of the stack compared to the at least one further block. By integrating multiple highly-conductive blocks in one and the same component carrier, the electric and/or thermal performance of the component carrier may be further improved.

Also, in the presence of at least one further highly-conductive block, the component carrier may have a symmetrical or an asymmetrical build-up.

In an embodiment, the at least one further highly-conductive block extends up to or beyond one or both opposing main surfaces of the component carrier. Thus, also the at least one further block may be arranged closer to a periphery of the stack than the semiconductor component being embedded deeper inside of the stack. Therefore, the multiple blocks may cooperate to remove heat out of an interior of the component carrier and/or to conduct an electric current with low resistance or impedance.

In an embodiment, the block and at least one of the at least one further block are arranged side-by-side rather than being vertically displaced along the stacking direction. For instance, multiple blocks can be arranged horizontally adjacent to one another, i.e., at the same vertical level inside of the stack. By taking this measure, it is for instance possible to remove heat or conduct electric current in relation to multiple semiconductor components being embedded in the stack, wherein each of such multiple semiconductor components may be assigned to a respective one of the blocks in terms of electric coupling and/or thermal coupling.

In an embodiment, the block and at least one of the at least one further block are arranged for vertically sandwiching the semiconductor component in between. In other words, the block and the at least one further block may be displaced vertically, i.e., the block and the further block may be separated along the stacking direction. In particular, arranging two highly-conductive blocks on both opposing main surfaces of the semiconductor component may further improve the thermal and/or electrical performance of the component carrier. For instance, this may be advantageous when both opposing main surfaces of the semiconductor component have pads, i.e., are electrically connected face up and face down. It is however also possible that one block conducts electric current and is connected to pads of the semiconductor component, whereas the opposing other highly-conductive block is used to remove heat out of an interior of the component carrier.

In an embodiment, the semiconductor component is a power semiconductor chip. When the semiconductor component is a power semiconductor (for instance a transistor chip), enormous amounts of heat may be generated during operation of the component carrier. Removing this heat out of an interior of the stack suppresses undesired phenomena resulting from excessive thermal load, such as warpage or cracks.

In an embodiment, the component carrier comprises a heat sink or cooling body attached to an exterior main surface of the block. Such a heat sink may, for instance, be a cooling body with cooling fins or may be a fluid-based cooling body cooling the component carrier by a flow of gas (for instance air) or liquid (for instance water).

In an embodiment, the component carrier comprises a dielectric and heat conductive thermal interface material (TIM) attached to an exterior main surface of the block. For instance, such a TIM may be connected to a heat sink attached to the stack. Such a thermal interface material may be a material having a dielectric behavior but a high-thermal conductivity so as to ensure a reliable electric isolation and at the same time a proper removal of heat out of an interior of the component carrier.

In an embodiment, the component carrier comprises a cooling channel formed in the block and being configured for accommodating cooling fluid. The cooling channel may also extend partially through the block and partially through the stack. Such a cooling channel may be formed for instance by drilling, milling or etching an interior channel in the block and by guiding a coolant (such as air or water) to the channel. It is also possible to embed a filament (as a sacrificial structure) in a preform of the block (for instance within not yet connected sinter particles) and/or the stack (for instance between layer structures of the stack), interconnect block and stack (for example by sintering and lamination), and to subsequently pull the filament out of the interconnected block and/or stack so that the cooling channel is created where the filament has been located before.

In an embodiment, the component carrier comprises a heat pipe thermally connected to the block, in particular partially arranged inside of the block and partially outside of the block. For instance, the heat pipe may extend up to or even beyond a lateral sidewall of the stack. In the context of the present application, the term "heat pipe" may particularly denote a heat-transfer structure that combines the principles of both thermal conductivity and phase transition of a fluid in an interior of the heat pipe to efficiently manage the transfer of heat from the block to a periphery of the component carrier. At a hot interface of a shell of the heat pipe the fluid in a liquid phase in contact with the thermally conductive block turns into a gas/vapor by absorbing heat from the block. The gas/vapor then travels, guided by a guiding structure, along the heat pipe structure to a cold interface of the shell at or even outside of an exterior surface of the stack and condenses back into a liquid, thereby releasing the latent heat or phase transition heat. The liquid then returns, guided by the guiding structure, to the hot side through one or more mechanisms such as capillary action, centrifugal force, gravity, or the like, and the cycle repeats. However, heat pipes may also use another heat transporting medium than a fluid, for instance a solid such as wax. Such a heat pipe may also significantly contribute to the removal of heat out of an interior of the component carrier. For instance, one portion of the heat pipe may be embedded in the block (which can be advantageously accomplished by sintering), whereas another portion of the heat pipe ex-tends to a periphery of the stack or even beyond the stack and thereby guides the heat out of the component carrier.

In an embodiment, the semiconductor component is an active component or a passive component. An active component may be any type of circuit component with the ability to electrically control electron flow (for instance according to the principle: "electricity controlling electricity"). Components being not capable of controlling current by another electrical signal may be denoted as passive components. Resistors, capacitors, inductors, transformers, and diodes are examples for passive components. Examples for active components are transistors, circuits composed of multiple transistors, silicon-controlled rectifiers, etc. Thus, the described concept of embedding one or more semiconductor components is very flexible in terms of implemented semiconductor components and can be used for both passive components (for instance a diode) or active components (for in-stance a transistor-based semiconductor component).

In an embodiment, the block is directly connected to the semiconductor component, in particular by a sinter connection structure of the block or of the semiconductor component. By directly connecting the block to the semiconductor component, a particularly appropriate electric and/or thermal coupling may be established.

In another embodiment, the block is connected to the semiconductor component via the at least one electrically conductive layer structure. By arranging at least one electrically conductive layer structure between the block and the semiconductor component, further tasks such as establishing an electric redistribution may be realized.

In an embodiment, at least part of at least one main surface and/or at least part of at least one sidewall of the block is covered or surrounded with at least one of the at least one electrically conductive layer structure. For instance, it is possible to fully surround one or both main surfaces and/or to fully surround one or more sidewalls of the block with electrically conductive material of the mentioned layer structure(s). Thus, the block may be encapsulated partially or entirely along one or more surfaces thereof by an electrically conductive material such as copper. This may further promote the thermal and/or electric coupling of the block with regard to the rest of the component carrier.

In an embodiment, the semiconductor component comprises at least one pad (in particular a plurality of pads) on a main surface of the semiconductor component, which main surface faces away from the block. In particular, the semiconductor component may be arranged face-up on or above the block. The at least one pad may extend up to an upper main surface of the component carrier or may be electrically accessible from an upper main surface of the component carrier. This may simultaneously allow to properly electrically access the semiconductor component while efficiently removing heat.

In an embodiment, a main surface of the block has a larger area than a main surface of the semiconductor component facing said main surface of the block. In a viewing direction perpendicular to the opposing main surfaces of the component carrier, an outline of the semiconductor component may be completely within a larger outline of the block. Alternatively, an outline of the semiconductor component may overlap with a larger outline of the block. The provision of a block with a larger dimension than the semiconductor component may ensure proper cooling.

In an embodiment, the method comprises forming a cavity in the stack and subsequently inserting the block and/or the semiconductor component in the cavity. Formation of a cavity (i.e., a blind hole or a through-hole) in the stack (for instance in a central core thereof) or in a peripheral portion of the stack renders it possible to easily embed the block and/or the semiconductor component by simply placing it in the cavity. For instance, the cavity may be formed by mechanically drilling, laser processing, etching, etc.

In an embodiment, the method comprises forming the cavity by integrating a non-adhesive release structure in the stack, and removing a piece of stack material above the release structure to thereby obtain the cavity. The piece may be spatially delimited by the non-adhesive release structure and by a circumferential cutting line, which may be formed for instance by mechanically cutting or laser cutting. According to such a preferred embodiment, a release layer made of a material having non-adhesive properties with regard to surrounding component carrier material is firstly embedded in the stack. Secondly, a portion of the stack above the release layer can be removed by cutting a circumferential line from an exterior of the stack extending up to the release layer. This can for instance be accomplished by mechanically drilling or by laser drilling. Due to the non-adhesive properties of the release layer, the circumferentially separated piece of the stack above the release structure or layer can subsequently simply be taken out of the stack, and a cavity may be obtained. A semiconductor component and/or a block may be subsequently simply placed inside the cavity for embedding.

In an embodiment, the method comprises connecting the semiconductor component to the block before embedding the component and the block in the stack. Thus, establishing a connection between a block and a semiconductor component prior to the embedding allows reducing the number of pieces to be handled during assembly and/or allows to reduce a number of cavities formed during embedding. In particular, establishing a sinter connection between block and semiconductor component prior to embedding may be simple and may avoid high temperatures (as may occur during sintering) impacting the stack.

In another embodiment, the method comprises connecting the semiconductor component to the block only after embedding the component and before embedding the block in the stack (or after embedding the block and before embedding the component in the stack). In particular, the semiconductor component may be embedded deep in the interior of the stack (for instance may be embedded in a core of the stack) and may be connected (directly or indirectly) to the block after inserting the block in a cavity of the stack, in particular by sintering. Also, this embodiment is a simple and reliable way of producing the component carrier.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carrier is configured as one of a group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, each of the above mentioned electrically insulating layer structures comprises at least one of a group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, each of the above mentioned electrically conductive layer structures comprises at least one of a group consisting of copper, aluminum, nickel, silver, gold, palladium, and tungsten. Although copper is usually preferred, other materials or coated versions thereof are possible as well, in particular materials coated with a supra-conductive material such as graphene.

In an embodiment, the semiconductor component may be a power semiconductor chip comprising a transistor and/or a diode. However, the semiconductor component may also be a microprocessor. In yet another embodiment, the semiconductor component may be a radiofrequency semiconductor chip configured for emitting and/or receiving radiofrequency signals. Hence, the semiconductor component may be configured for executing a radio frequency application, in particular a radio frequency application involving frequencies above 1 GHz.

At least one further component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

BRIEF DESCRIPTION OF THE DRAWINGS

FIG. 1, FIG. 2, FIG. 3, FIG. 4, FIG. 5, FIG. 6, FIG. 7, to FIG. 8 illustrate cross-sectional views of structures obtained during carrying out a method of manufacturing a component carrier with an embedded component, shown in FIG. 9, according to an exemplary embodiment of the invention.

FIG. 10 illustrates a cross-sectional view of a component carrier and FIG. 11 shows a top view of part of the component carrier according to another exemplary embodiment of the invention.

FIG. 12, FIG. 13 to FIG. 14 illustrate cross-sectional views of a component carrier with embedded semiconductor components according to still another exemplary embodiment of the invention.

FIG. 15, FIG. 16, FIG. 17, FIG. 18 to FIG. 19 illustrate cross-sectional views of structures obtained while carrying out a method of manufacturing a component carrier with an embedded component, shown in FIG. 20, according to yet another exemplary embodiment of the invention.

DETAILED DESCRIPTION OF EXEMPLARY EMBODIMENTS

Figure 5:
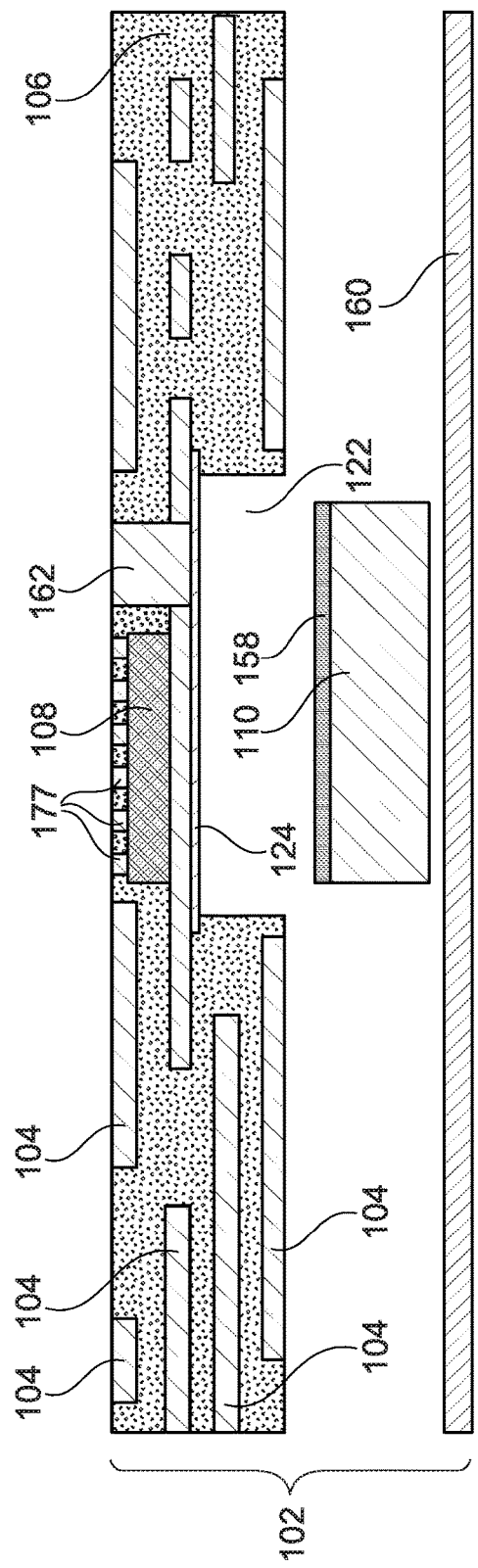

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component carrier is provided in which a highly-conductive block (preferably a copper block) is directly integrated with an (in particular active or passive) semiconductor component in a layer stack of a (for instance printed circuit board type, PCB) component carrier. This makes possible an improved cooling, heat conductance, heat spreading and a low ohmic current flow. The one or more (in particular copper) blocks can be integrated in direct or indirect contact after having embedded the semiconductor component in the stack. The semiconductor component may for instance be a power semiconductor chip. This allows connecting the semiconductor component chip within a component carrier stack with a very low thermal resistance.

For manufacturing such a component carrier, it is possible to insert an at least partially conductive block (for instance a copper block) as a conductive depot in a cavity. The cavity may be formed in a component carrier layer stack so as to at least partially connect the highly-conductive block to the semiconductor component, for instance a MOSFET chip. This may allow obtaining an improved cooling, heat conductance, heat spreading and low ohmic current flow. For instance, it may be possible to obtain a current up to 1 kA, for instance when a copper block of a thickness of 500 μm is used.

When a semiconductor component such as a power semiconductor chip is to be embedded in a component carrier, the involved high currents and powers conventionally require thicker copper structures for conducting current and removing heat. This however involves an increased effort in terms of copper deposition, for instance by plating. This is in particular disturbing when copper is not desired in certain regions of a stack as part of electrically conductive layer structures of the stack.

According to an exemplary embodiment of the invention, the electrically conductive layer structures of the stack (in particular copper structures) may be maintained tiny, which is advantageous in view of the above considerations. At the same time, any issues concerning heat removal and/or low ohmic conductance of current and signals may be removed by the embedding of the one or more highly-conductive blocks in the stack. In particular, heat spreading around an angle of about 45° in an upward and/or downward direction may be achieved in this context. A high amount of copper in the electrically conductive traces may be advantageously prevented by exemplary embodiments of the invention.

Thus, in order to at least partially overcome the above-mentioned and/or other shortcomings, exemplary embodiments of the invention insert one or more highly-conductive blocks (in particular copper blocks) as purely solid inlays or as porous sinter bodies in the stack and closely connected or coupled to the semiconductor component. This may improve heat removal and/or a low ohmic conductance of electric current or signals without the need to form electrically conductive traces or electrically conductive layer structures of the stack from thick copper material. As a result, a simple manufacturing of the component carrier may be made possible. It is particularly preferred to manufacture the one or more highly-conductive blocks by three-dimensional laser sintering directly on copper material of the stack and/or of the semiconductor component. The block may be made of a highly electrically conductive and thermally conductive material such as a copper or aluminum.

According to an exemplary embodiment of the invention, a multilayer stack is provided having a core with an embedded semiconductor component. One or more cavities may be formed in the stack, for instance using the above-described concept of buried release layers. Subsequently, one or more highly-conductive blocks (such as copper blocks or three-dimensional copper sinter depots) may be inserted into the cavity and may be connected to the stack and/or to the semiconductor component preferably by sintering. Thus, a sinter structure may be formed between the block on the one hand and the electrically conductive layer structures and/or the pads of the semiconductor component on the other hand.

In an alternative embodiment, a block may firstly be connected to the semiconductor component. Subsequently, the arrangement of block and semiconductor component may be embedded in a cavity of the stack of the component carrier.

In exemplary embodiments, a short thermal and/or electric path may be established in an interior of the component carrier. A direct or indirect coupling of the block to the semiconductor component is made possible. The block may be implemented for heat removal and/or conductance of electric current.

Exemplary embodiments of the invention may have the advantage that it is possible to implement a highly-conductive block which does not extend over the entire area of the component carrier. This makes a compact configuration possible. Furthermore, it is possible to properly thermally and/or electrically connect a highly-conductive block in an interior of a component carrier. Furthermore, it may be possible to separate the semiconductor component at a sinter position with regard to the copper material so that the sinter layer can simultaneously function as a stress release layer.

FIG. 1 to FIG. 9 illustrate cross-sectional views of structures obtained during carrying out a method of manufacturing a component carrier 100 with an embedded semiconductor component 108, shown in FIG. 9, according to an exemplary embodiment of the invention.

Referring to FIG. 1, constituents of a stack 102 are shown which are to be connected with one another, in particular by lamination. As shown, the layer stack 102 is composed of multiple planar layer structures 104, 106 so that the formed component carrier 100 is a plate-shaped laminate type printed circuit board (PCB) component carrier. The constituents of the stack 102 comprise electrically conductive layer structures 104 and electrically insulating layer structures 106. The electrically conductive layer structures 104 are composed of patterned metal layers such as patterned copper foils and may also comprise vertical through connections such as copper filled laser vias. The electrically insulating layer structures 106 may comprise sheets comprising resin (in particular epoxy resin), optionally comprising reinforcing particles (such as glass fibers or glass spheres) therein. For instance, the electrically insulating layer structures 106 may be made of prepreg.

Furthermore, a semiconductor component 108 such as a naked die is shown in FIG. 1 which is embedded in the stack 102. As shown, the semiconductor component 108 has one or more electric contacts 177 (such as pads or pillars, preferably made of copper). In the shown embodiment, the electric contacts 177 are oriented upwardly, so that semiconductor component 108 is oriented face up. It is however alternatively also possible that the electric contacts 177 are oriented downwardly, so that semiconductor component 108 may be oriented face down. In still other embodiments, it is possible to provide electric contacts 177 on both opposing main surfaces of the semiconductor component 108. For instance, the semiconductor component 108 is a power semiconductor chip like a silicon transistor chip. More generally, the semiconductor component 108 may be any active component or passive component. It is also possible to embed more than one semiconductor component 108 in the stack 102, for instance one or more active components and/or one or more passive components. During operation of the readily manufactured component carrier 100, the semiconductor component 108 may generate a considerable amount of heat.

More specifically, FIG. 1 shows a first core 150 composed of electrically conductive layer structures 104 and electrically insulating layer structures 106.

The mentioned first core 150 is arranged in FIG. 1 adjacent to a central electrically insulating layer structure 106, for instance a sheet of still uncured prepreg.

A second core 152 is arranged above said electrically insulating layer structure 106. Said second core 152, which may also be denoted as a power core, already has embedded semiconductor component 108 such as a power semiconductor chip. An electrically conductive inlay 162, for instance a copper inlay, is placed side-by-side to the semiconductor chip 108 within the second core 152. A layer-shaped release structure 124 made of a non-adhesive material (such as a wax or polytetrafluoroethylene) is attached to a lower main surface of the second core 152, to define a position where subsequently a cavity 122 is to be formed (compare FIG. 4).

FIG. 1 also illustrates a stacking direction 199, i.e. a direction along which the various layer structures 104, 106 are stacked and will be interconnected. The stacking direction 199 is oriented perpendicular to the main surfaces of said layer structures 104, 106 and the stack 102 formed on the basis of said layer structures 104, 106, as also indicated by right angles in FIG. 1.

As shown in FIG. 2, the cores 150, 152 and the electrically insulating layer structure 106 in between are interconnected by lamination, i.e., the application of heat and/or pressure. As a result, integrally formed stack 102 is obtained.

Now referring to FIG. 3, reference numeral 154 schematically illustrates a laser beam which cuts circumferentially out a disk-shaped or plate-shaped piece 156 of the stack 102 beneath the release structure 124. In other words, the piece 156 is defined by the release structure 124 and by an obtained circumferential cutting line.

Referring to FIG. 4, it is illustrated that cavity 122 is formed in the stack 102. As shown and described, piece 156 of stack 102 above the release structure 124 may be removed after the circumferential cutting procedure shown in FIG. 3 to thereby obtain the cavity 122. Due to the non-adhesive properties of the release structure 124, the cut-out piece 156 (see FIG. 3) can be simply taken out of the rest of the stack 102.

Referring to FIG. 5, a block 110 is shown which is shaped and dimensioned so as to be insertable in the cavity 122. The block 110 is a thermally highly conductive and electrically highly-conductive block 110 which is preferably made of copper. Advantageously, the block 110 may be formed as a three-dimensional sinter body. Thus, the method may comprise forming the block 110 by carrying out a three-dimensional sinter process. Alternatively, it is also possible that the block 110 is an inlay of solid non-porous copper. FIG. 5 shows the structure of FIG. 4 together with the highly-conductive block 110 which is provided with a sinter connection structure 158 on one main surface of the block 110. By the sinter connection structure 158, the block 110 will later be connected to the stack 102.

Furthermore, an additional sheet 160 is shown in FIG. 5, which may be made of electrically insulating material. In one embodiment, the additional sheet 160 is made of prepreg. In another embodiment, the additional sheet 160 may be configured as a thermal interface material (TIM), as will be described in further detail referring to FIG. 12. In the latter case, the material of the sheet 160 may be thermally conductive and electrically insulating.

Figure 6:
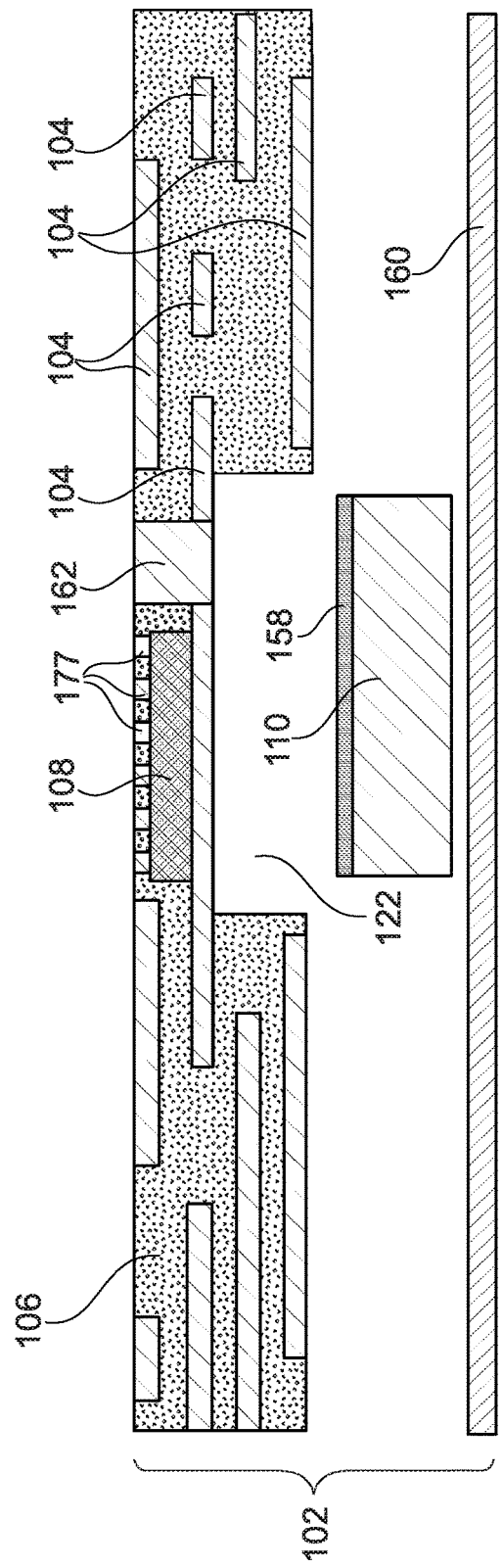

FIG. 6 shows that the release structure 124 is removed from the bottom of the cavity 122 prior to subsequent processing. Due to the non-adhesive property of the material of the release structure 124, it can be easily removed by a chemical and/or mechanical treatment.

Figure 7:
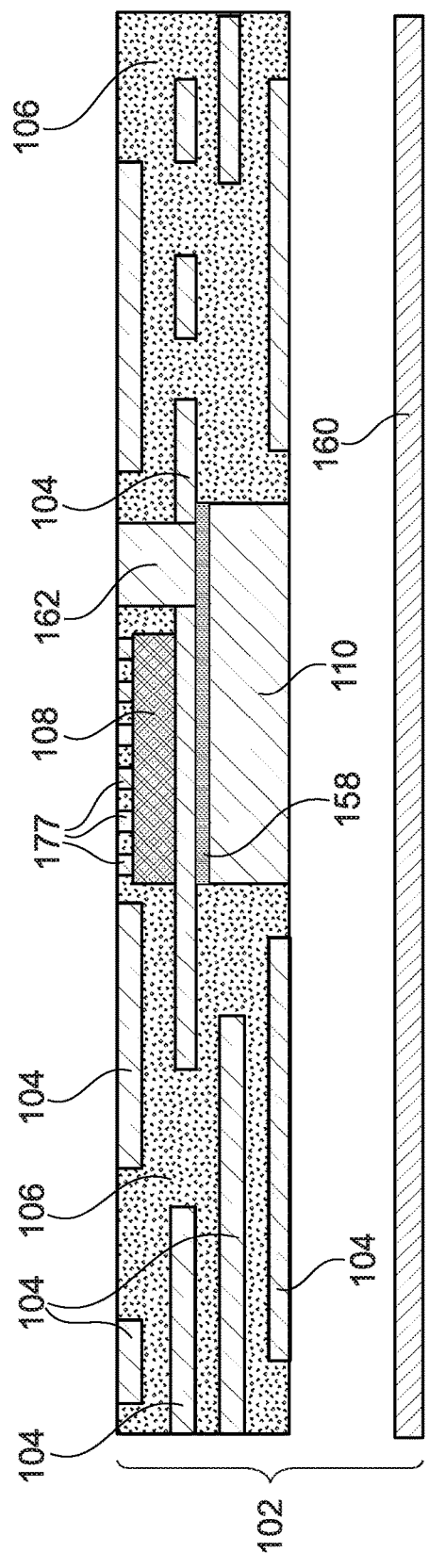

Referring to FIG. 7, the block 110 is inserted into the cavity 122, and the sinter connection structure 158 of the block 110 is connected with one of the thin electrically conductive layer structures 104 delimiting a bottom of the cavity 122 (after having removed release structure 124) by sintering. Thereby, also the semiconductor component 108 is thermally coupled with the block 110 via said thin electrically conductive layer structure 104 in between. Thus, the block 110 is mechanically and thermally connected to the semiconductor component 108 via said electrically conductive layer structure 104 and by said sinter connection structure 158. Highly advantageously, the thermal path between semiconductor component 108 and block 110 may be extremely short, which may result in an excellent removal of heat generated by the semiconductor component 108 through the block 110. More specifically, the block 110 is directly connected with said electrically conductive layer structure 104 and quasi directly with the semiconductor component 108.

Thus, the block 110 is connected within the stack 102 for removing and spreading heat generated by the semiconductor component 108 during operation of the component carrier 100. Due to the shown geometry, the block 110 may efficiently contribute to the removal of heat from an interior of the manufactured component carrier 100 towards the lower main surface of the stack 102. As a result of the procedure of forming cavity 122 and inserting block 110 completely into cavity 122, the block 110 completely fills cavity 122 and is therefore aligned with and flushes with an exterior main surface of the layer structures 104, 106.

Still referring to FIG. 7, the copper block 110 is connected to said electrically conductive layer structure 104 of the stack 102 by sintering, to thereby connect the sinter connection structure 158 to the mentioned electrically conductive layer structure 104.

Figure 8:
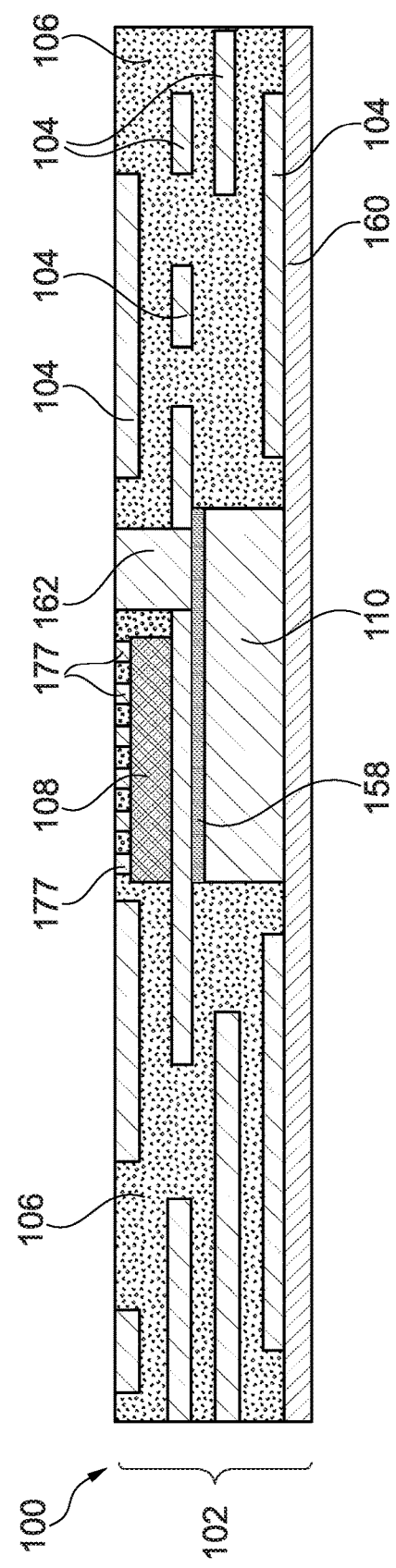

As shown in FIG. 8, the electrically insulating sheet 160 may be subsequently connected to the structure shown in FIG. 7, for instance by adhesion or lamination. As shown in FIG. 8, the semiconductor component 108 comprises pads 177 on an upper main surface of the semiconductor component 108, which upper main surface faces away from the block 110.

Moreover, an upper main surface of the block 110 has a larger area than a lower main surface of the semiconductor component 108 facing said upper main surface of the block 110.

As a result, a component carrier 100 according to an exemplary embodiment of the invention and shown in FIG. 9 is obtained.

A schematic plan view 164 of FIG. 9 shows that the highly-conductive block 110 couples the semiconductor component 108 also with electrically conductive inlay 162 (for instance a copper inlay). The inlay 162 may also be a copper pillar.

The illustrated component carrier 100 comprises the stack 102 comprising the laminated electrically conductive layer structures 104 and the laminated electrically insulating layer structures 106. Semiconductor component 108 is fully embedded in the stack 102 so that electric contacts 177 extend up to an upper main surface of the component carrier 100 for connection to an electronic periphery. Highly-conductive block 110 is embedded within the stack 102 and is fully circumferentially surrounded by material of the stack 102.

FIG. 9 additionally shows that an optional cooling channel 118 is formed in the block 110 (and optionally also in the stack 102) and is configured for guiding cooling fluid, such as water or air, to further improve the cooling performance of the block 110. By the cooling channel 118, a coolant such as water or air can be guided to the embedded block 110 to further improve the capability of removing heat from thermally coupled semiconductor component 108.

Cooling channel 118 may be formed by drilling, etching or laser processing. Alternatively, a filament (not shown) may be embedded in a preform of the block 110 (for instance within not yet connected sinter particles thereof). By pulling the filament (for instance made of steel) out of the block 110 after sintering, the cooling channel 118 can be created within block 110. The described concept of a filament as sacrificial structure may be also applied when the cooling channel 118 shall partially extend through the layer structures 104, 106, 160 of the stack 102.

Figure 11:
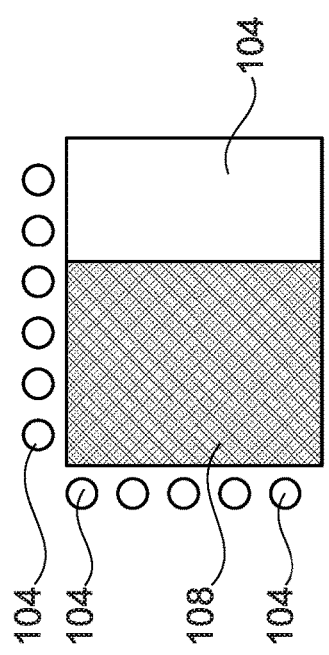

FIG. 10 illustrates a cross-sectional view and FIG. 11 shows a partial top view of a component carrier 100 according to another exemplary embodiment of the invention.

The component carrier 100 according to FIG. 10 and FIG. 11 comprises a further highly-conductive block 110 which may have the same features as previously described block 110. Moreover, the component carrier 100 according to FIG. 10 and FIG. 11 comprises a further semiconductor component 108 which may have the same features as previously de-scribed semiconductor component 108. According to FIG. 10, the embed-ding of the (in the shown embodiment two) highly thermally conductive blocks 110 in the stack 102 is carried out so that the (in the shown embodiment two) semiconductor components 108 are embedded in stacking direction 199 of the stack 102 more centrally than the blocks 110, being located closer to a periphery or an exterior main surface of the stack 102. This results in a short thermal flow path oriented advantageously from the center towards a periphery of the stack 102, so that the heat removal is highly efficient.

As shown, the block 110 and the further block 110 are arranged side-by-side and at the same vertical level of the stack 102. Correspondingly, the semiconductor component 108 and the further semiconductor component 108 are arranged side-by-side and at the same vertical level of the stack 102, but more centrally in the stack 102 than the blocks 110, 110. According to FIG. 10 and FIG. 11, an embodiment is shown having two semi-conductor components 108, each assigned to a respective one of the blocks 110 in terms of thermal coupling.

In an embodiment, it is also possible that blocks 110 with a variable height are embedded in the stack 102 (for instance to balance out height differences or functional differences), depending on the power conditions of a respective application.

Furthermore, FIG. 10 shows a further build-up on an upper main surface of the semiconductor components 108. This further build-up includes one or more further electrically insulating layer structures 106 and one or more further electrically conductive layer structures 104, including vertical through-connections such as (in particular copper-filled) laser vias 166 and (in particular copper) pillars or posts 168.

Again, referring to the partial top view according to FIG. 11, the chip-type semiconductor component 108 is laterally surrounded by conductive connections in form of vias (extending in z direction) as further electrically conductive layer structures 104. Those vias in z direction may conduct electrical signals (as shown in FIG. 14) as well as support to direct heat towards the blocks 110 and/or heat sinks 112 (while using as short paths as possible, compare FIG. 13).

The second surface that can be seen from the top view of FIG. 11 is a conductive surface partially located below the semiconductor component 108, partially extending laterally beyond the semiconductor component 108.

Figure 12:
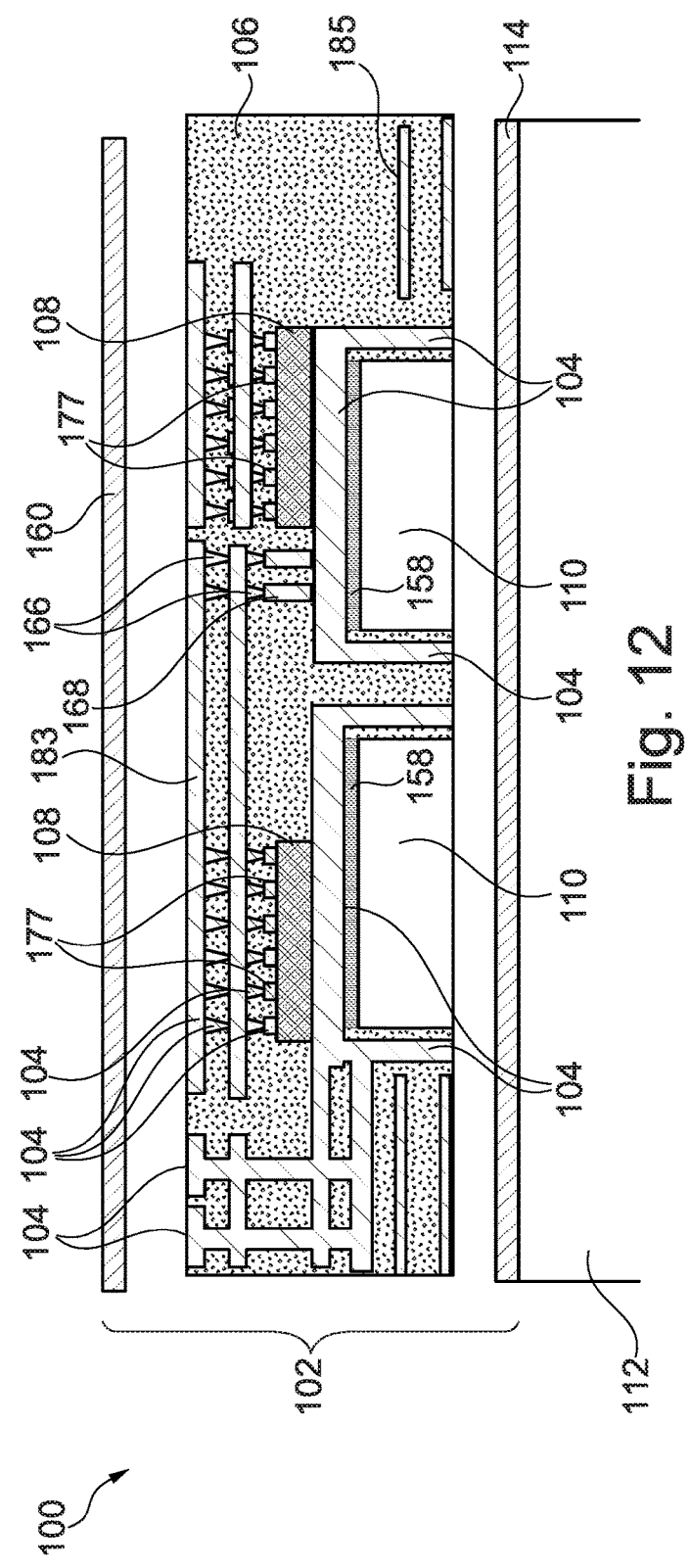

FIG. 12 to FIG. 14 illustrate cross-sectional views of a component carrier 100 with embedded semiconductor components 108 in a half-bridge configuration according to still another exemplary embodiment of the invention.

Referring to FIG. 12, the illustrated component carrier 100 comprises a heat sink 112 (such as a cooling body) attached to an exterior main surface of the stack 102. Moreover, a thermally conductive and electrically insulating thermal interface material 114 may be arranged between blocks 110 and heat sink 112. When a heat sink 112 is provided, it may also be possible to omit the thermal interface material 114. The thermal interface material 114 and/or heat sink 112 may improve the cooling performance. Blocks 110 being thermally coupled with semiconductor components 108 may significantly contribute to heat removal and heat spreading and are thermally coupled to thermal interface material 114 and/or heat sink 112.

Furthermore, a respective upper main surface and sidewalls of the block 110 are covered with or surrounded by electrically conductive layer structures 104. Thus, FIG. 12 shows an embodiment in which the blocks 110 are surrounded at upper main surfaces as well as at its sidewalls by electrically conductive layer structures 104. This establishes an electric coupling of the blocks 110 to the semiconductor components 108 and ensures a high current conductance by the blocks 110 (for instance by a parallel circuitry of the blocks 110). Thus, according to FIG. 12, the blocks 110 are electrically coupled in a low ohmic fashion with the semi-conductor components 108 and can carry current during operation of the component carrier 100. For instance, the shown arrangement is compatible with current values of 100 Ampère or more flowing through the blocks 110.

Furthermore, an excellent heat management promoted by the blocks 110 can be combined with thick copper structures (see reference numeral 183) for current management and thin signal lines (see reference numeral 185).

The enormous heat removal by component carrier 100 is illustrated by arrows 172 in FIG. 13.

Arrows 174 in FIG. 14 indicate a current flow. A phase connection is indicated with reference numeral 176.

FIG. 15 to FIG. 20 illustrate cross-sectional views of structures obtained during carrying out a method of manufacturing a component carrier 100 with embedded semiconductor components 108 and an even larger number of embedded blocks 110, shown in FIG. 20, according to yet another exemplary embodiment of the invention.

Figure 15:
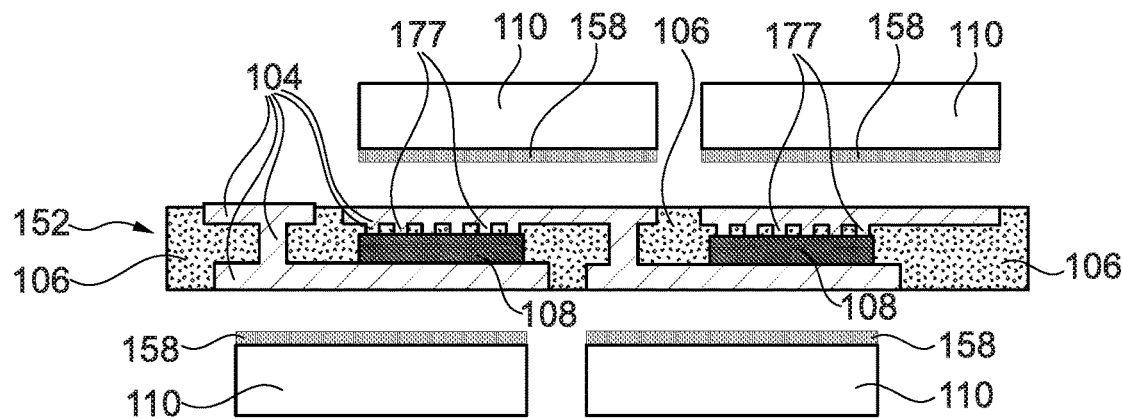

In FIG. 15, four highly electrically and highly thermally conductive blocks 110 are shown which are arranged on two opposing main surfaces of power core 152.

Figure 16:
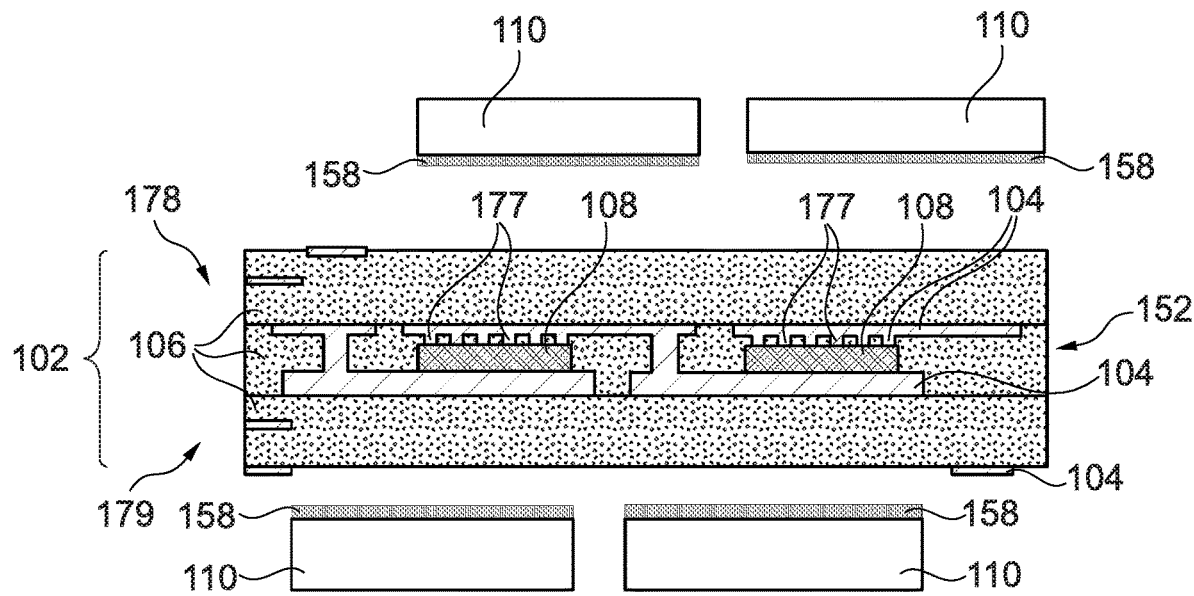

FIG. 16 shows the four copper blocks 110 on both opposing main surfaces in a configuration in which the power core 152 has been connected with further cores 178, 179 on both opposing main surfaces of power core 152.

Figure 17:
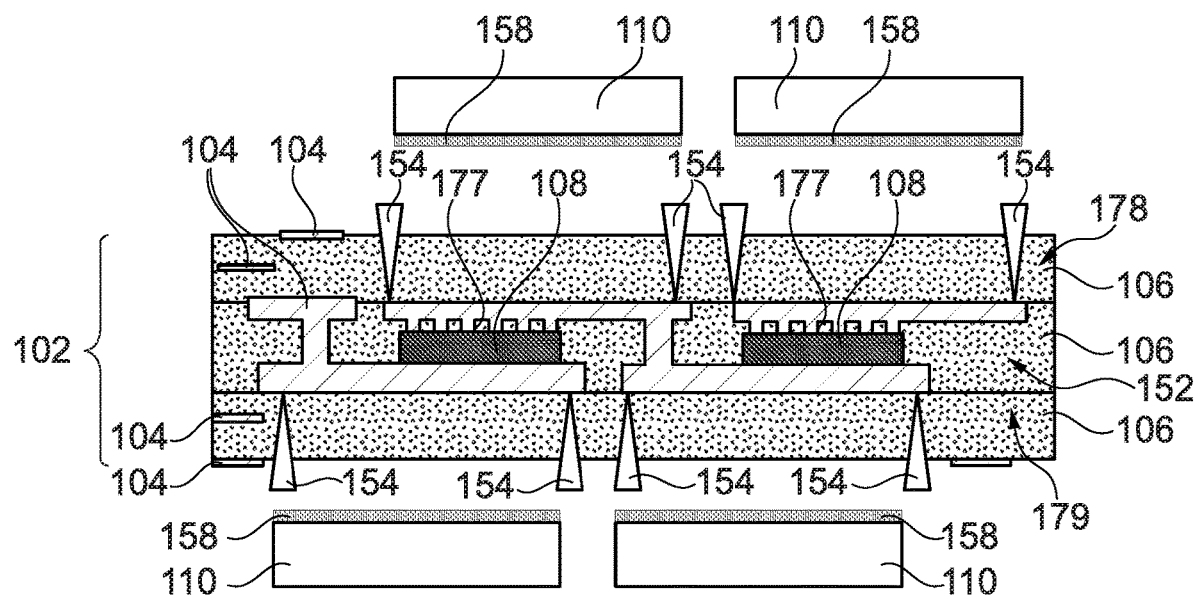
Figure 18:
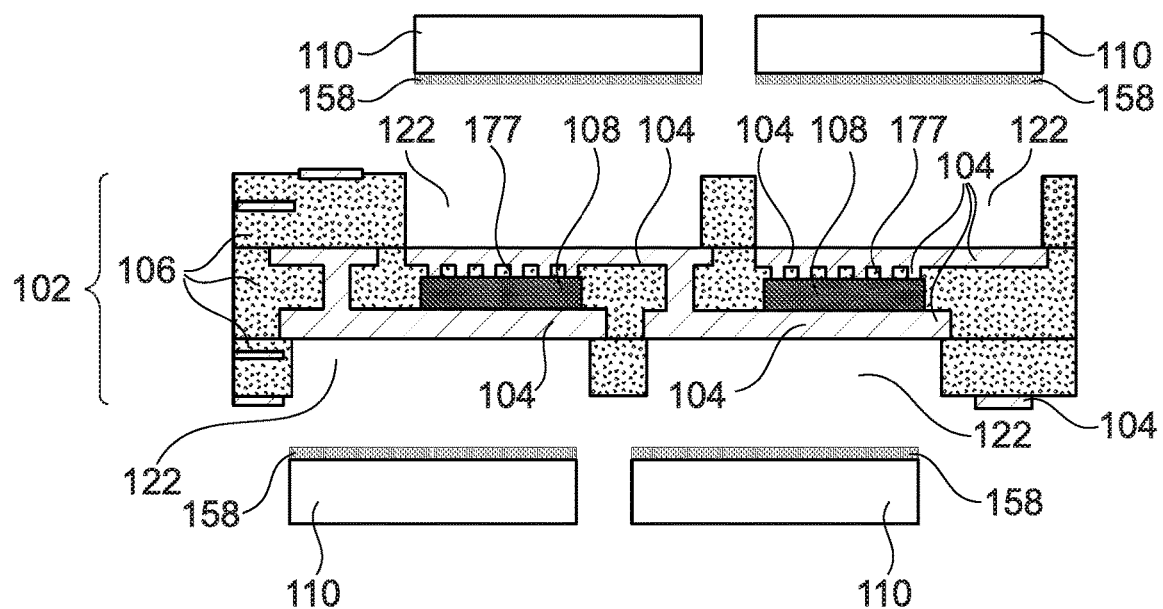

FIG. 17 illustrates that, by laser processing, portions of the further cores 178, 179 may be removed by laser cutting or the like to form cavities 122 shown in FIG. 18 for embedding the blocks 110. As described above, a release structure 124 may support this cavity formation procedure.

Referring to FIG. 19, a component carrier 100 according to an exemplary embodiment of the invention is shown which is manufactured based on the structure shown in FIG. 18. Each of the blocks 110 has meanwhile been inserted into a respective cavity 122, and a sinter connection between the blocks 110 and adjacent electrically conductive layer structures 104 has meanwhile been established by sinter connection structures 158. On a respective upper main surface of each of the semiconductor components 108, the respective semiconductor component 108 is electrically and thermally coupled to a corresponding one of the blocks 110. On a respective lower main surface of each of the semiconductor components 108, the respective semiconductor component 108 is thermally coupled to a corresponding one of the blocks 110. Furthermore, the upper blocks 110 are electrically and thermally coupled with the lower blocks 110 via electrically conductive layer structures 104.

An optional heat pipe 120 is shown which is thermally connected to one of the blocks 110. The heat pipe 120 is partially arranged inside of the block 110 and partially outside of block 110 and extends beyond a lateral sidewall of the stack 102. Thus, heat pipe 120 is embedded partially in block 110, partially in the stack 102 and partially extends beyond the stack 102. Alternatively, the heat pipe 120 may also extend up to the sidewall of the stack 102, i.e. in alignment with the sidewall of the stack 102. Such a heat pipe 120 may significantly improve heat removal out of an interior of the component carrier 100.

FIG. 20 shows a component carrier 100 in which, in addition to FIG. 19, vertical through-connections 190 are formed extending through the entire stack 102 and also through some of the blocks 110. The vertical through connections 190 may be formed by drilling and may be at least partially filled with electrically conductive material such as copper for further improving the electric performance and/or thermal performance of the component carrier 100.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a stack comprising at least one electrically conductive layer structure and/or at least one electrically insulating layer structure;
   a semiconductor component embedded in the stack;
   a highly-conductive block provided with a sinter connection structure on one main surface of the highly conductive block;
   wherein the highly conductive block is embedded in the stack and the sinter connection structure of the highly conductive block is connected to the electrically conductive layer structure so that the highly conductive block is thermally coupled with the semiconductor component via the electrically conductive layer structure in between.

2. The component carrier according to claim 1, comprising at least one of the following features:
   wherein the highly conductive block and the semiconductor component are placed on opposite sides of the same electrically conductive layer structure;
   wherein the electrically conductive layer structure is composed of a patterned copper foil;
   wherein the semiconductor component is embedded in the stack more centrally in a stacking direction of the stack compared to the highly conductive block;
   wherein the highly conductive block is made of a thermally highly conductive and/or electrically highly conductive material being at least one of a group consisting of copper, aluminium, graphite, a graphite/aluminium compound, and a ceramic with a copper coating;
   wherein the highly conductive block is an inlay;
   wherein the highly conductive block is formed as a three-dimensionally sintered body;
   wherein the highly conductive block extends up to or partially beyond an exterior main surface of the stack;
   wherein the highly conductive block is thermally coupled to the semiconductor component for removing and/or spreading heat generated by the semiconductor component during operation of the component carrier;
   wherein the highly conductive block is electrically connected with at least one of the at least one electrically conductive layer structure and/or with the semiconductor component for conducting electric current or electric signals during operation of the component carrier.

3. The component carrier according to claim 1, further comprising:
   at least one further highly-conductive block embedded in the stack in such a way that the semiconductor component is embedded in the stack more centrally in a stacking direction of the stack compared to the at least one further block.

4. The component carrier according to claim 3, comprising at least one of the following features:
   wherein the at least one further highly conductive block extends up to or beyond one or both opposing main surfaces of the component carrier;
   wherein the highly conductive block and the at least one further highly conductive block are arranged side-by-side at the same layer level;
   wherein the semiconductor component is arranged in the stacking direction between the highly conductive block and the at least one further highly conductive block;
   at least one further semiconductor component connected to the further highly conductive block.

5. The component carrier according to claim 1, comprising at least one of the following features:

wherein the semiconductor component is a power semiconductor chip;
comprising a heat sink attached to an exterior main surface of the highly conductive block;
a dielectric and heat conductive thermal interface material attached to an exterior main surface of the highly conductive block;
a cooling channel formed in the block and being configured for guiding a cooling fluid;
a heat pipe thermally connected to the highly conductive block, partially arranged inside of the highly conductive block and partially outside of the highly conductive block extending up to or beyond a lateral sidewall of the stack;
wherein the semiconductor component is an active component or a passive component;
wherein the highly conductive block is mechanically connected to the semiconductor component via at least one of the at least one electrically conductive layer structure.

6. The component carrier according to claim 1, wherein at least part of at least one main surface and/or at least part of at least one sidewall of the highly conductive block is surrounded by at least one of the at least one electrically conductive layer structure.

7. The component carrier according to claim 1, wherein the semiconductor component comprises at least one pad on a main surface of the semiconductor component, which main surface faces away from the highly conductive block.

8. The component carrier according to claim 1, wherein a main surface of the highly conductive block has a larger area than a main surface of the semiconductor component facing said main surface of the highly conductive block.

9. The component carrier according to claim 1, comprising at least one of the following features:
wherein the component carrier has a symmetrical or an asymmetrical build-up;
at least one further component being surface mounted on and/or embedded in the component carrier, wherein the at least one further component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a flux gate, a further component carrier, and a logic chip;
wherein at least one of the at least one electrically conductive layer structure comprises at least one of a group consisting of copper, aluminum, nickel, silver, gold, palladium, and tungsten;
wherein at least one of the at least one electrically insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
wherein the component carrier is shaped as a plate;
wherein the component carrier is configured as one of the group consisting of a printed circuit board, and a substrate, or a preform thereof;
wherein the component carrier is configured as a laminate-type component carrier.

10. A method of manufacturing a component carrier, the method comprising:
forming a stack comprising at least one electrically conductive layer structure and/or at least one electrically insulating layer structure;
embedding a semiconductor component in the stack;
providing a highly conductive block with a sinter connection structure on one main surface of the highly conductive block; and
embedding the highly-conductive block in the stack and connecting the sinter connection structure of the highly conductive block to the electrically conductive layer structure so that the highly conductive block is thermally coupled with the semiconductor component via the electrically conductive layer structure in between.

11. The method according to claim 10, further comprising:
forming a cavity in the stack and subsequently inserting the highly conductive block in the cavity.

12. The method according to claim 11, wherein the method comprises forming the cavity by:
integrating a non-adhesive release structure in the stack; and
removing a piece of the stack which is partially delimited by the release structure to thereby obtain the cavity.

13. The method according to claim 10, wherein the method comprises forming the highly conductive block by three-dimensionally sintering.

14. The method according to claim 10, wherein the method comprises connecting the semiconductor component to the highly conductive block by sintering.

15. The method according to claim 10, wherein the method comprises connecting the semiconductor component to the highly conductive block before embedding the component and the highly conductive block in the stack.

16. The method according to claim 10, wherein the method comprises connecting the semiconductor component to the highly conductive block after embedding the semiconductor component and before embedding the highly conductive block in the stack.

17. A method, comprising:
providing a component carrier, which comprises a stack with at least one electrically conductive layer structure and/or at least one electrically insulating layer structure, the component carrier further having a semiconductor component embedded in the stack, and a highly-conductive block embedded in the stack and being thermally and/or electrically coupled with the semiconductor component through a sinter connection structure on a main surface of a highly conductive block; and
conducting an electric current of in particular in a range between 100 Ampère and 10000 Ampère by the highly-conductive block embedded in the stack.

18. The component carrier according to claim 1, further comprising:
at least one further highly conductive block embedded in the stack in such a way that the semiconductor component is embedded in the stack more centrally in a stacking direction of the stack compared to the at least one further block; and at least one further semiconductor component connected to the at least one further highly conductive block so that a half-bridge configuration is formed.

19. The component carrier according to claim 1, wherein the semiconductor component comprises one or more electric contacts, and the semiconductor component is embedded in the stack face up so that the one or more electric contacts are oriented upwardly.

20. The method according to claim 11, wherein the highly conductive block and the semiconductor component are placed on opposite sides of the same electrically conductive layer structure.

* * * * *